United States Patent [19]
Steigerwald et al.

[11] Patent Number: 6,166,602
[45] Date of Patent: Dec. 26, 2000

[54] HIGH-EFFICIENCY SWITCHING POWER AMPLIFIER

[75] Inventors: Robert Louis Steigerwald, Burnt Hills, N.Y.; William Frederick Wirth, Johnson Creek, Wis.

[73] Assignee: General Electric Company, Schenectady, N.Y.

[21] Appl. No.: 09/406,405

[22] Filed: Sep. 27, 1999

[51] Int. Cl.[7] ..................................................... H03F 3/217
[52] U.S. Cl. ..................... 330/251; 330/207 A; 327/124; 363/132
[58] Field of Search ................................ 330/207 A, 251, 330/297; 327/124; 363/132, 131, 62, 124, 71, 65

[56] References Cited

U.S. PATENT DOCUMENTS

| | | | |
|---|---|---|---|
| 4,527,228 | 7/1985 | Chi Yu | 363/98 |
| 4,864,479 | 9/1989 | Steigerwald et al. | |
| 4,873,618 | 10/1989 | Fredrick et al. | 363/17 |
| 5,625,539 | 4/1997 | Nakata et al. | 363/17 |
| 5,663,647 | 9/1997 | Wirth et al. | |
| 5,781,419 | 7/1998 | Kutkut et al. | 363/17 |
| 5,801,936 | 9/1998 | Mori et al. | 363/132 |
| 5,892,664 | 4/1999 | Vedder | 363/17 |
| 6,016,258 | 1/2000 | Jain et al. | 363/17 |
| 6,031,746 | 2/2000 | Steigerwald et al. | 363/71 |

*Primary Examiner*—Robert Pascal
*Assistant Examiner*—Henry Choe
*Attorney, Agent, or Firm*—Jill M. Breedlove; Douglas E. Stoner

[57] ABSTRACT

A plurality of low-voltage, series-connected input dc-dc converters provide the input to a low-frequency, high-voltage dc-ac output bridge converter suitable for driving a gradient coil in an MRI system. The relatively low-voltage, series-connected dc-dc converters, or choppers, control the gradient coil current, while the dc-ac converter bridge steers the current to the proper coil polarity. A binary weighting of the voltage ratings of the input choppers results in the lowest voltage unit doing most of the high-frequency switching. Such an amplifier configuration is modular and allows for different gradient coil requirements to be met with a common approach by applying a predetermined number of choppers and bridges.

10 Claims, 4 Drawing Sheets

| $V_{out}$ | "on" chopper |
|---|---|
| 0 | none |
| 100 | 1 |
| 200 | 2 |
| 300 | 1,2 |
| 400 | 3 |
| 500 | 1,3 |
| 600 | 2,3 |
| 700 | 1,2,3 |
| 800 | 4 |
| 900 | 1,4 |
| 1000 | 2,4 |
| 1100 | 1,2,4 |
| 1200 | 3,4 |
| 1300 | 1,3,4 |
| 1400 | 2,3,4 |
| 1500 | 1,2,3,4 |

HIGH-EFFICIENCY SWITCHING POWER AMPLIFIER

BACKGROUND OF THE INVENTION

The present invention relates generally to power amplifiers and, more particularly, to switching power amplifiers such as of a type suitable for driving magnetic resonance imaging (MRI) gradient coils, for example.

Gradient coils in MRI systems require high, rapidly changing current as well as precise current control. To achieve fast current changes, a high voltage drive is needed, requiring high-voltage, high-current semiconductors (typically insulated gate bipolar transistors, i.e., IGBT's). Higher voltage devices generally have higher switching losses, limiting the maximum switching frequency attainable. With high switching losses, the time interval permitted for the high-voltage inverter to switch at a sufficiently high frequency to maintain precise current waveforms is also limited.

Accordingly, it is desirable to provide a switching amplifier that reduces and distributes device switching losses such that arbitrary waveforms can be maintained for extended periods of time, thereby enabling high-performance advanced imaging. It is also desirable to provide a switching amplifier having the flexibility and capability to supply gradient coils having different requirements (e.g., voltage, current and frequency). It is also desirable to provide such a switching amplifier with minimal filtering, output ripple, and amplifier losses.

BRIEF SUMMARY OF THE INVENTION

In an exemplary embodiment of the present invention, a plurality of low-voltage, series-connected dc-dc converters provide the input to a low-frequency, high-voltage dc-ac output bridge converter suitable for driving a gradient coil in an MRI system. The relatively low-voltage, series-connected dc-dc converters, or choppers, control the gradient coil current, while the dc-ac converter bridge steers the current to the proper coil polarity. The output bridge switching losses are minimized because its high-voltage devices switch only at low frequencies. The input chopper switching losses are minimized because such losses are shared among several choppers and further because lower-voltage, faster switching devices are employed. A binary weighting of the voltage ratings of the input choppers results in the lowest voltage unit doing most of the high-frequency switching. Such an amplifier configuration is modular and allows for different gradient coil requirements to be met with a common approach by applying a predetermined number of choppers and bridges.

DETAILED DESCRIPTION OF THE INVENTION

Figure 1:
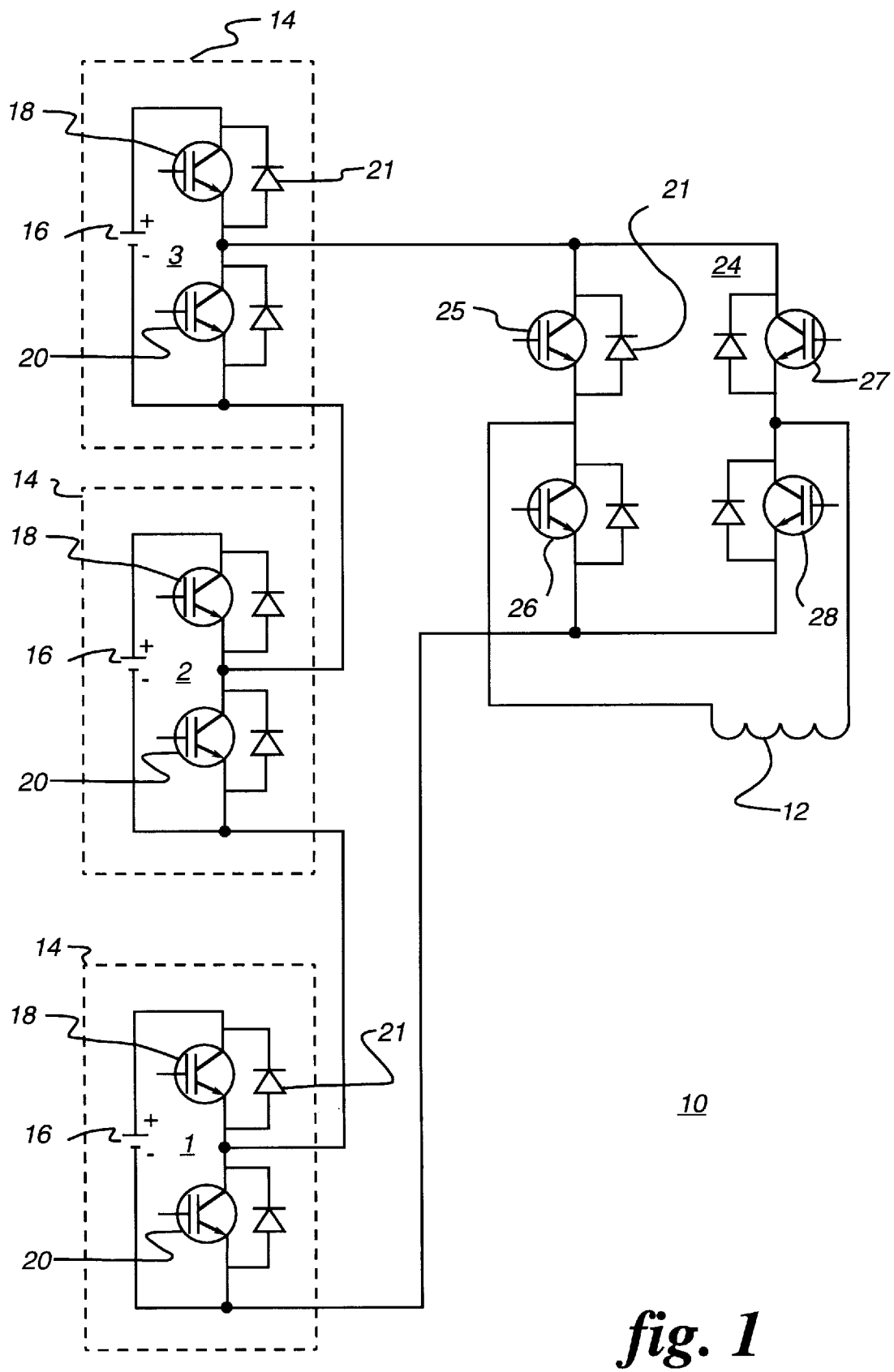
FIG. 1 schematically illustrates an exemplary embodiment of a high-voltage gradient driver with low-voltage input choppers in accordance with the present invention.

FIG. 1 illustrates an exemplary high-voltage driver 10 in accordance with the present invention suitable for driving an MRI gradient coil 12, for example. (It is to be understood that voltage values provided herein and in the drawing figures are provided by way of example only. The invention is not limited to the values provided herein.) Driver 10 comprises a plurality (shown as three in FIG. 1) of input dc-dc converters 14, each having a relatively low input bus supply 16 (e.g., 400 Vdc) for supplying a low-frequency dc-ac converter 24 which supplies the coil. Each input converter, or chopper, 14 is shown as having two switching devices 18 and 20 connected in a half-bridge configuration. (Exemplary switching devices shown in the drawing figures comprise insulated gate bipolar transistors (IGBT's), each having an inverse-parallel diode 21.) Converter 24 is preferably a full-bridge converter, having four switching devices 25–28, rated for the full voltage applied to the gradient coil. However, bridge converter 24 does not operate at high frequencies. Therefore, readily available high-voltage switching devices can be used without high switching losses. Such high-voltage switching devices may comprise either 1700V or 3300V IGBT's, for example. To further minimize switching losses, the choppers 14 feeding the output bridge converter 24 use lower voltage, faster switching devices 18 and 20. As illustrated in the embodiment of FIG. 1, an individual inductor is not associated with each chopper. Instead, one output inductor (i.e., the gradient coil) is used. In addition, small, high-frequency filters (not shown) are preferably used between the output of bridge converter 24 and coil 12.

In the embodiment of FIG. 1, N input choppers 14 are used to provide a maximum dc output voltage of N*Vdc volts to the dc-ac converter 24. For lower-voltage loads, N is reduced depending on the application.

Choppers 14 can be operated in different modes. In one mode, the chopper periods can be offset so that the switching is interleaved. Interleaving is achieved by operating each chopper 360/N degrees phase-shifted relative to the first chopper. This results in an output frequency of N*f, where f is the individual chopper switching frequency. Due to the higher switching frequency, smaller output current ripple and smaller filters (not shown) can therefore be used. As a result, the output ripple frequency is relatively high, i.e., N times the individual frequency of each chopper.

In another chopper mode, operation of the choppers is staged such that only one chopper does all the chopping (the switching chopper), and the other choppers switch in after the switching chopper reaches its maximum pulse width. For example, in FIG. 1, if the lower chopper (1) comprises the switching chopper, then it will increase its pulse width from zero to 100%. After it reaches 100%, if more voltage is needed, then the second chopper (2) switches fully on, while the switching chopper (1) returns to 0% duty cycle. Then, the switching chopper can continue to increase its pulse width as more voltage is needed above the input bus supply voltage (e.g., 400V). The same technique is used when more than 800V are needed, and so on for greater than 1200V. In this staging method of operation, only one chopper does the high-frequency switching while the others switch at low frequency. Moreover, the high-frequency switching is performed by relatively low-voltage, fast-switching devices. Thus, faster switching devices are preferably used in the switching chopper, while more inexpensive, slower devices having a lower forward voltage drop could be used in the other choppers. The output voltage can be as high as needed by adding additional choppers 14 in series. Each chopper comprises a single module. The limit on the number of input choppers 14 is reached when there is no longer an output bridge low-frequency switching device available for blocking the total coil voltage, i.e., the maximum output voltage of all choppers connected in series.

Figure 2:
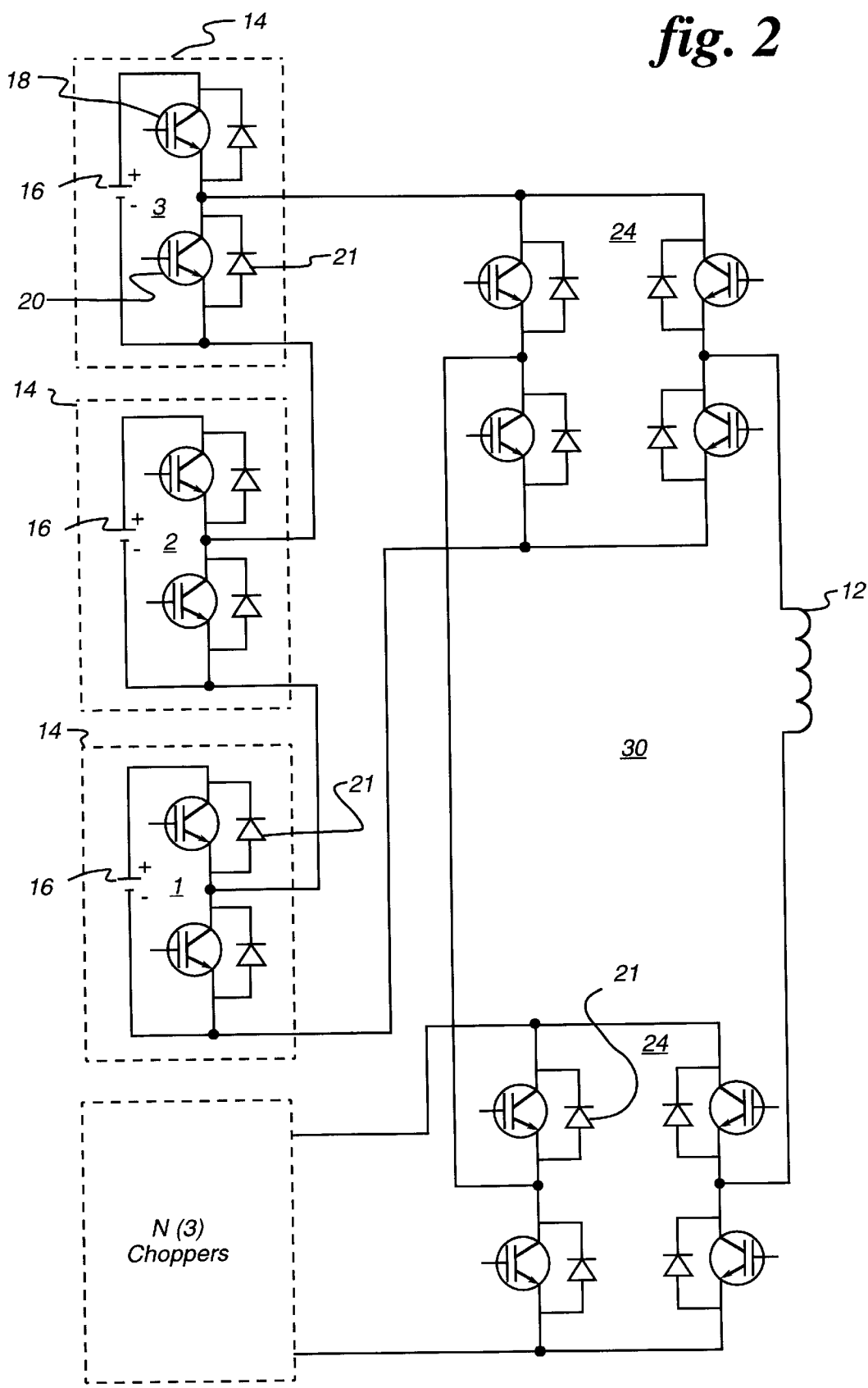
FIG. 2 schematically illustrates another exemplary embodiment of a high-voltage gradient driver in accordance with the present invention.

If even higher voltages are needed, then an alternative embodiment of a switching amplifier driver 30, as illustrated in FIG. 2, may comprise stacked output bridge converters 24. In the particular embodiment of FIG. 2, two output bridge converters are shown as being stacked, but more may be desirable depending on the application. For the embodiment of FIG. 2, for N input choppers, a maximum output dc voltage of Vdc*y*N is provided to the dc-ac bridge converter 24, where y represents the number of stacked output bridge converters; i.e., y=2 for FIG. 2.

Figure 3:
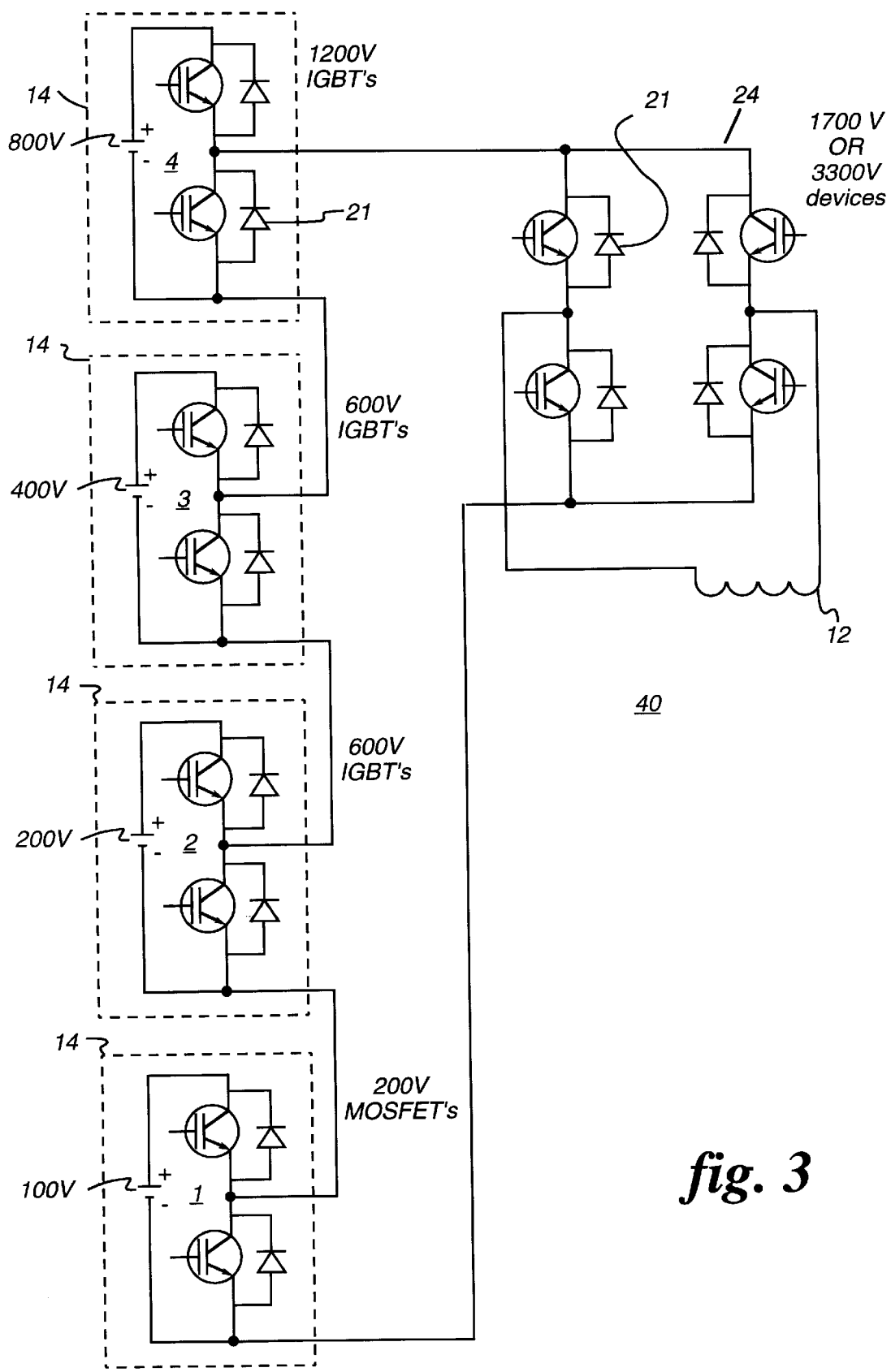
FIG. 3 schematically illustrates another exemplary embodiment of a high-voltage gradient driver in accordance with the present invention having binary weighted input choppers.

FIG. 3 illustrates another alternative embodiment of a switching amplifier driver 40 wherein the input voltages are binary-weighted; i.e., each input chopper has an input dc voltage of $2^n$ where n is the number of the choppers. This allows $2^N$ voltage levels to be applied to the gradient coil, where N is again defined as the number of input choppers. (In contrast, the drivers of FIGS. 1 and 2 allow only N voltage levels to be applied to the coil.)

Figure 4:
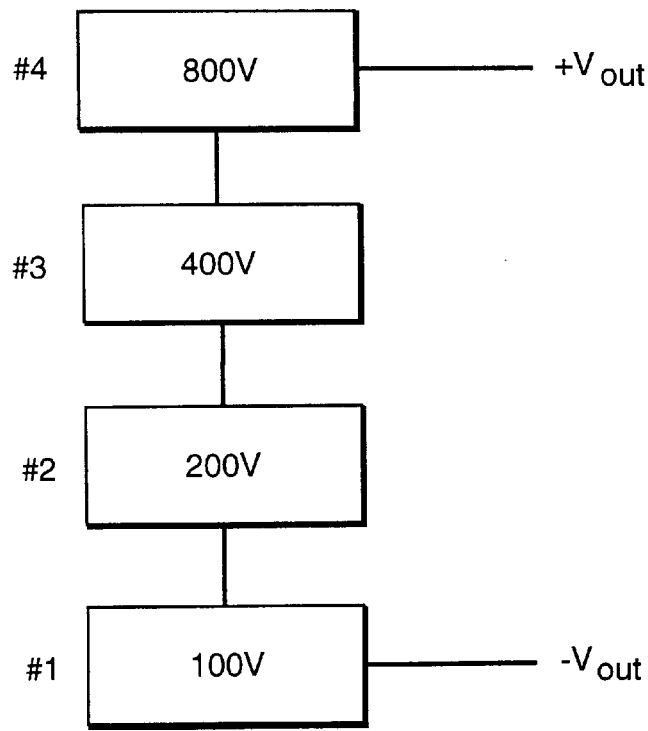
FIG. 4 illustrates exemplary voltage levels attainable with binary weighted choppers such as those of FIG. 3.

FIG. 4 illustrates the possible discrete chopper output voltages for the particular case of four choppers 14, as illustrated in FIG. 3. In FIG. 4, "on" means that the upper chopper device is turned on such that the chopper provides a voltage equal to its input dc voltage; "off" means that the chopper provides zero voltage as a result of the lower chopper switch being turned on. For voltages between those listed in the table of FIG. 4, the choppers are pulse width modulated (PWM). For example, if 650 volts were desired, then chopper 1 would switch on and off at high frequency at a 50% duty cycle; choppers 2 and 3 would be on for both 600 and 700 volts and thus would not switch at all. Chopper 1, which is the lowest voltage bridge, performs most of the switching, while the highest voltage bridge (4) switches the least (i.e., only between 700 and 800 volts), resulting in low switching losses. During PWM operation for voltages in between those listed in the table of FIG. 4, there is a voltage change of only 100 volts, independent of the output voltage. This greatly reduces the ripple voltage applied to the output filter (between converter 24 and coil 12, but not shown) and gradient coil, leading to smaller filter requirements and better performance. Such a 100V chopper could be implemented with very low switching loss MOSFET's, for example.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A switching power amplifier, comprising:

a plurality N of series-connected input dc-dc converters for converting an input dc voltage to an output dc voltage; and at least one dc-ac output converter for receiving the output dc voltage from the input dc-dc converters and for providing an output ac voltage and current;

the input dc-dc converters controlling magnitude of the output current, and the output dc-ac converter controlling the polarity of the output current.

2. The switching power amplifier of claim 1 wherein the input dc-dc converters each comprise a half-bridge connection of switching devices.

3. The switching power amplifier of claim 1 wherein the output converter comprises a full-bridge converter.

4. The switching power amplifier of claim 1 comprising one output dc-ac converter such that a maximum voltage of N times the input dc voltage is provided to the output converter.

5. The switching power amplifier of claim 1 wherein a plurality y of output converters are stacked such that a maximum voltage of y times N times the input dc voltage is provided to the output converter.

6. The switching power amplifier of claim 1 wherein the input converters operate in an interleaved mode such that the switching operation of each input converter is phase-shifted 360/N degrees relative to the first operating input converter.

7. The switching power amplifier of claim 1 wherein the input converters operate in a staged mode such that a first one of the input converters performs the switching function with the other input converters switching in after the first input converter reaches its maximum pulse width.

8. A switching power amplifier, comprising:

a plurality N of series-connected input dc-dc converters, each input dc-dc converter receiving an input voltage having a value of $2^n$ times the input voltage, where n represents the number of the input converter, the input converters being numbered from 1 to N and providing an output dc voltage; and a dc-ac output converter for receiving the output dc voltage from the input dc-dc converters and for providing an output ac voltage in $2^N$ levels.

9. The switching power amplifier of claim 8 wherein the input dc-dc converters each comprise a half-bridge connection of switching devices, and wherein the output converter comprises a full-bridge converter.

10. The switching power amplifier of claim 8 wherein the input dc-dc converters are pulse width modulated to achieve output voltages between each $2^N$ voltage level.

* * * * *